United States Patent
Kim et al.

(10) Patent No.: US 8,457,450 B2
(45) Date of Patent: *Jun. 4, 2013

(54) PRINTED CIRCUIT BOARD AND MANUFACTURING METHOD THEREOF

(75) Inventors: Sang-Hoon Kim, Gunpo-si (KR);
Je-Gwang Yoo, Yongin-si (KR);
Joon-Sung Kim, Suwon-si (KR); Han Seo Cho, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 378 days.

This patent is subject to a terminal disclaimer.

(21) Appl. No.: 12/314,449

(22) Filed: Dec. 10, 2008

(65) Prior Publication Data

US 2009/0103860 A1 Apr. 23, 2009

Related U.S. Application Data

(62) Division of application No. 11/984,114, filed on Nov. 13, 2007, now Pat. No. 7,489,839.

(30) Foreign Application Priority Data

Nov. 21, 2006 (KR) .................. 10-2006-0115391

(51) Int. Cl.
*G02B 6/12* (2006.01)
(52) U.S. Cl.
USPC ............. 385/14; 385/49; 385/130; 385/139
(58) Field of Classification Search
USPC ................... 385/14, 49, 130, 139
See application file for complete search history.

(56) References Cited

U.S. PATENT DOCUMENTS

| | | | |
|---|---|---|---|
| 5,054,870 A | 10/1991 | Lösch et al. | 385/14 |
| 5,125,054 A * | 6/1992 | Ackley et al. | 385/49 |
| 5,737,458 A | 4/1998 | Wojnarowski et al. | |
| 5,761,350 A | 6/1998 | Koh | 385/14 |
| 5,994,975 A | 11/1999 | Allen et al. | |

(Continued)

FOREIGN PATENT DOCUMENTS

| | | |
|---|---|---|
| JP | 2003-227951 | 8/2003 |
| JP | 2003-243563 | 8/2003 |
| JP | 2006-140233 | 6/2006 |
| JP | 2006-243467 | 9/2006 |

OTHER PUBLICATIONS

U.S. Appl. No. 11/984,114, Nov. 13, 2007, Sang-Hoon Kim, Samsung Electro-Mechanics Co., Ltd.

(Continued)

*Primary Examiner* — Ellen Kim

(57) ABSTRACT

A printed circuit board is disclosed. A printed circuit board, which includes a first board part, a flexible board part which has one side coupled with the first board part and which includes an electrical wiring layer and an optical waveguide to transmit both electrical signals and optical signals, and a second board part coupled with the other side of the flexible board part, where the electrical wiring layer and the optical waveguide are disposed with a gap in-between, can provide greater bendability and reliability, by having the optical waveguide and electrical wiring layer separated with a gap in-between at the flexible portion of the board, and the optical waveguide can be manufactured with greater precision for even higher reliability, by having the optical waveguide manufactured separately and then inserted during the manufacturing process of the board.

14 Claims, 15 Drawing Sheets

U.S. PATENT DOCUMENTS

| | | | |
|---|---|---|---|
| 6,763,164 B2 | 7/2004 | Kashihara et al. | |
| 7,348,786 B2 | 3/2008 | Thacker et al. | 324/754 |
| 8,056,220 B2 * | 11/2011 | Kim et al. | 29/829 |
| 2004/0190831 A1 | 9/2004 | Lu et al. | |
| 2007/0183718 A1 | 8/2007 | Bae et al. | 385/47 |

OTHER PUBLICATIONS

U.S. Appl. No. 12/314,450, Dec. 10, 2008, Sang-Hoon Kim, Samsung Electro-Mechanics Co., Ltd.

Japanese Office Action dated Jun. 22, 2010 and issued in corresponding Japanese Patent Application 2007-291164.

U.S. Notice of Allowance mailed Oct. 8, 2008 in related U.S. Appl. No. 11/984,114.

U.S. Requirement for Restriction mailed Jul. 10, 2008 in related U.S. Appl. No. 11/984,114.

Japanese Office Action dated Oct. 26, 2010 and issued in corresponding Japanese Patent Application 2007-291164.

Japanese Office Action dated Nov. 1, 2011 issued in corresponding Japanese Patent Application No. 2010-211622.

U.S. Patent Office Action mailed Apr. 7, 2011 in corresponding U.S. Appl. No. 12/314,450.

U.S. Patent Notice of Allowance mailed Aug. 29, 2011 in corresponding U.S. Appl. No. 12/314,450.

* cited by examiner

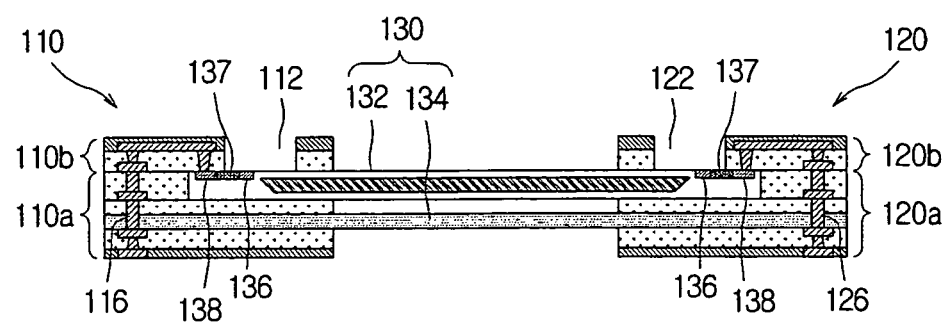

PRINTED CIRCUIT BOARD AND MANUFACTURING METHOD THEREOF

CROSS-REFERENCE TO RELATED APPLICATIONS

This application is a U.S. divisional application filed under 35 USC 1.53(b) claiming benefit of U.S. Ser. No. 11/984,114 filed in the United States on Nov. 13, 2007, now U.S. Pat. No. 7,489,839 which claims earlier benefit to Korean Patent Application No. 10-2006-0115391 filed with the Korean Intellectual Property Office on Nov. 21, 2006, the disclosure of which is incorporated herein by reference in its entirety.

BACKGROUND OF THE INVENTION

1. Field of the Invention

The present invention relates to a printed circuit board.

2. Description of the Related Art

A rigid-flexible printed circuit board is in wide use in network equipment and mobile electronic products such as cell phones, etc. In mobile electronic products, in particular, there is a high demand for printed circuit boards having flexibility, since maneuverability is required of folders, sliders, or more complicated structures.

Compared to boards using electrical copper wiring, boards that use optical signals are unaffected by EMI and EMC, so that they may be more resistant to external noise and may not require the use of grounds or differential wiring. There may also be the advantage of enabling the transfer of high-speed signals, due to low loss.

An example of a conventional structure for embedding an optical waveguide in a flexible or rigid-flexible printed circuit board is as illustrated in FIG. 1A and FIG. 1B. Since it is effective to use copper wiring, even in a printed circuit board having an embedded optical waveguide, for transferring electrical power and low-speed analog signals, a board structure is generally presented in which electrical wiring and optical wiring are included together.

With the flexible or rigid-flexible printed circuit board, it may be required to provide sufficient bendability and high reliability in the bending portions. The bending characteristics may be determined by the thickness and strength of the flexible portions and the stiffness and strength of the material, while it may be especially desirable to keep the thickness small.

However, in the structure of a conventional printed circuit board having an embedded optical waveguide, the electrical wiring layer and the optical waveguide layer are attached, so that there is less bendability compared to typical electrical wiring boards, and there is a higher risk of defect or reliability problems.

SUMMARY OF THE INVENTION

An aspect of the invention is to provide a printed circuit board and a method of manufacturing a printed circuit board, which offer greater bendability and reliability, by having the optical waveguide and electrical wiring layer separated with a gap in-between at the flexible portion of the board.

One aspect of the claimed invention may provide a printed circuit board, which includes a first board part, a flexible board part which has one side coupled with the first board part and which includes an electrical wiring layer and an optical waveguide to transmit both electrical signals and optical signals, and a second board part coupled with the other side of the flexible board part, where the electrical wiring layer and the optical waveguide are disposed with a gap in-between.

A groove may be formed in the first board part to install the optical waveguide. The groove may be adjacent to the optical waveguide and may be exposed to the exterior. A pad may be formed on a predetermined position of the optical waveguide adjacent to the groove, to mount the optical waveguide on. Here, the pad may be formed on the surface of the optical waveguide or may be buried in the optical waveguide.

Also, a rewiring land may be formed on the optical waveguide that is electrically connected with the pad, where the rewiring land, similar to the pad, may be formed on the surface of the optical waveguide or may be buried in the optical waveguide.

A via may be formed on the first board part for interlayer connection, where the rewiring land may be electrically connected with the via.

Another aspect of the claimed invention may provide a printed circuit board, which a first board, on a side of which a first ledge is formed, a second board, on a side of which a second ledge is formed and which is disposed with a gap of a predetermined distance with respect to the first board, a flexible optical waveguide having either end mounted on each of the first ledge and the second ledge, and a first outer board and a second outer board stacked respectively on the first board and the second board such that either end of the flexible optical waveguide are covered.

A groove may be formed in the first outer board to install the optical waveguide. The groove may be adjacent to the optical waveguide and may be exposed to the exterior. A pad may be formed on a predetermined position of the optical waveguide adjacent to the groove, to mount the optical waveguide on. Here, the pad may be formed on the surface of the optical waveguide or may be buried in the optical waveguide.

Also, a rewiring land may be formed on the optical waveguide that is electrically connected with the pad, where the rewiring land, similar to the pad, may be formed on the surface of the optical waveguide or may be buried in the optical waveguide.

A via may be formed on the first board part for interlayer connection, where the rewiring land may be electrically connected with the via.

Yet another aspect of the claimed invention may provide a method of manufacturing a printed circuit board having a flexible optical waveguide to transmit optical signals, which includes preparing a first board and a second board that are disposed with a gap in-between, forming a ledge on each of the first board and the second board such that either end of the flexible optical waveguide is mounted on each of the ledges, stacking the flexible optical waveguide on the first board and the second board such that the flexible optical waveguide is mounted by way of the ledges, and stacking a first outer board and a second outer board respectively on the first board and the second board such that either end of the flexible optical waveguide is covered.

A groove may be formed adjacent to the flexible optical waveguide in the first outer board, the groove configured to have the optical waveguide installed therein.

A groove may be formed adjacent to the flexible optical waveguide in the first outer board to install the optical waveguide, a pad may be formed on a predetermined position of the optical waveguide adjacent to the groove to mount the optical waveguide.

The flexible optical waveguide may include a core, through which optical signals propagate, and a cladding, which covers the core. Here, the pad may be formed by forming a conductive pattern on a carrier which corresponds to the pad, and pressing the cladding and the carrier such that the conductive pattern is transcribed onto the cladding.

Also, an additional rewiring land may be formed on the flexible optical waveguide that is electrically connected with the pad, where the rewiring land may be formed by forming a conductive pattern on a carrier that corresponds to the rewiring land, and pressing the cladding and the carrier such that the conductive pattern is transcribed onto the cladding.

Additional aspects and advantages of the invention will be set forth in part in the description which follows, and in part will be obvious from the description, or may be learned by practice of the invention.

BRIEF DESCRIPTION OF THE DRAWINGS

FIG. 9A, FIG. 9B, FIG. 9C and FIG. 9D are flow diagrams illustrating the method of manufacturing a printed circuit board shown in FIG. 8.

DETAILED DESCRIPTION OF THE PREFERRED EMBODIMENTS

Embodiments of the invention will be described below in more detail with reference to the accompanying drawings. In the description with reference to the accompanying drawings, those components are rendered the same reference number that are the same or are in correspondence regardless of the figure number, and redundant explanations are omitted.

First, the printed circuit board according to an aspect of the claimed invention will be described.

Figure 1A:
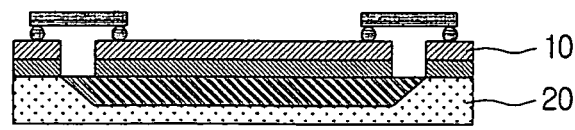
FIG. 1A and FIG. 1B are cross-sectional views illustrating a printed circuit board according to prior art.
Figure 1B:
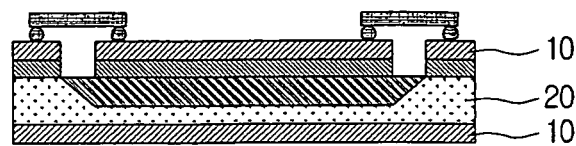
Figure 2:
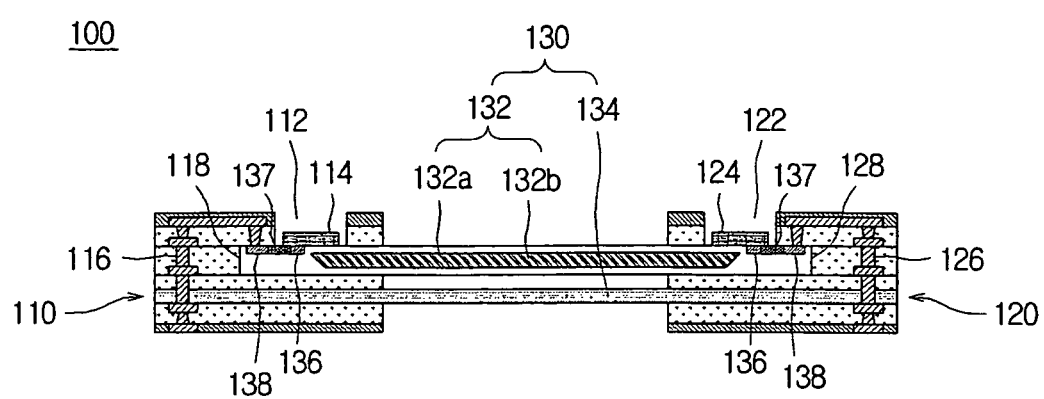
FIG. 2 is a cross-sectional view illustrating a printed circuit board according to a first disclosed embodiment of the invention.

FIG. 2 is a cross-sectional view illustrating a printed circuit board according to a first disclosed embodiment of the invention. In FIG. 2 are a illustrated first board part 110, a second board part 120, grooves 112, 122, photoelectric conversion elements 114, 124, vias 116, 126, ledges 118, 128, a flexible board part 130, an optical waveguide 132, a core 132a, a cladding 132b, an electrical wiring layer 134, pads 136, patterns 137, and rewiring lands 138.

At either end of a printed circuit based on this embodiment may be positioned the first board part 110 and the second board part 120, with the flexible board part 130 positioned between the first board part 110 and second board part 120 which has flexibility. That is, the flexible board part 130 may have both ends coupled to boards that are rigid. Here, the flexible board part 130 may be composed of an optical waveguide 132 for transmitting optical signals and an electrical wiring layer 134 for transmitting electrical signals.

Compared to the electrical wiring layer 134, which may use copper wiring for transmitting electrical signals, the optical waveguide 132 may be more resistant to external noise and may not require the use of grounds or differential wiring. The optical waveguide 132 may also allow the transfer of high-speed signals, due to low loss. The optical waveguide 132 may be composed of a core 132a, which may serve as a path for the transfer of optical signals, and a cladding 132b, which may surround the core 132a.

The core 132a may be the path for the transfer of optical signals, and may be surrounded by the cladding 132b. The core 132a may be made of a polymer material or an optical fiber material. In this embodiment, however, a core is presented that is made of a polymer material, which has superb flexibility and which may be more desirable in terms of miniaturizing the connecting structures with respect to the photoelectric conversion elements.

The cladding 132b may surround the core 132a and may allow an efficient transmission of optical signals. Similar to the core 132a, the cladding 132b may also be made of a polymer material. However, for efficient transfer of optical signals, the cladding 132b may be designed to have a refractive index lower than that of the core 132a.

While the electrical wiring layer 134 may be less favorable, compared to the optical waveguide 132 described above, in transferring high-speed signals, it may be favorable when supplying electrical power, not high-speed digital signals. Thus, it may be possible to omit the electrical wiring layer 134 and form only the optical waveguide 132, in fields requiring only the transmission of high-speed digital signals. However, since electrical power and analog signals may also be transmitted from the main board to the display board in general devices such as cell phones, the electrical wiring layer 134 may be formed as well as the optical waveguide 132.

FIG. 2 is a cross-sectional view illustrating a printed circuit board 100 according to a first disclosed embodiment of the invention, in which a flexible board part 130 is presented that has both the optical waveguide 132 and the electrical wiring layer 134.

In the first board part 110 and second board part 120, there may be grooves 112, 122 formed, in which the photoelectric conversion elements 114, 124 may be installed. By mounting the photoelectric conversion elements 114, 124 in these grooves 112, 122, the overall thickness of a printed circuit board 100 based on this embodiment may be reduced.

The photoelectric conversion elements 114, 124 may serve to convert electrical signals to optical signals or convert optical signals to electrical signals. The longer the distance from the photoelectric conversion elements 114, 124 to the optical waveguide 132, the greater the risk of errors created by losses and crosstalk in the optical signals. Thus, it may be advantageous to make the distance as short as possible from the photoelectric conversion elements 114, 124 to the optical waveguide 132.

To this end, in this embodiment, grooves 112, 122 may be formed in the first board part 110 and second board part 120, in which to install the photoelectric conversion elements 114, 124. Because of these grooves 112, 122, portions of the optical waveguide 132 may be exposed, and pads 136 may be formed on portions of the optical waveguide thus exposed such that the photoelectric conversion elements 114, 124 may be mounted on the pads 136.

Because of this structure, not only is the thickness reduced for the printed circuit board 100 according to this embodiment, but also the reliability of the signals is increased.

With respect to thus forming the pads 136 on the optical waveguide 132, while the pads 136 may be formed on the surface of the optical waveguide 132, the pads 136 may be buried in the optical waveguide 132, to further increase the effects of reducing the overall thickness and increasing the reliability of signals.

The pads 136 buried in the optical waveguide 132 may be formed by a process of first forming on a carrier (not shown) a conductive pattern corresponding to the pads, pressing the cladding 132b and the carrier (not shown) together, and afterwards removing the carrier from the cladding 132b, to transcribe the conductive pattern onto the cladding 132b.

In order that the circuit patterns (not shown) formed on the first board part 110 and second board part 120 and the photoelectric conversion elements 114, 124 may be electrically connected to each other, rewiring lands 138 may be formed on the optical waveguide 132 that are electrically connected with the pads 136, and the rewiring lands 138 may be electrically connected with the vias 116, 126 and circuit patterns (not shown) formed on the first board part 110 and second board part 120.

Similar to the pads 136 described above, the rewiring lands 138 may be formed on the surface of the optical waveguide 132, but may also be buried in the optical waveguide 132, and may be formed by a method similar to that used for the pads 136. That is, the rewiring lands 138 may be formed by a process of first forming a conductive pattern on a carrier that is in correspondence with the rewiring lands, pressing the cladding and carrier together, and then removing the carrier from the cladding, to transcribe the conductive pattern onto the cladding.

As illustrated in FIG. 2, this embodiment presents a configuration in which the rewiring lands 138 are connected directly with the vias 116, 126. Because the rewiring lands 138 are contacted through the vias 116, 126, there may not be a need for considerations on either the plating characteristics with respect to the material forming the optical waveguide 132 or hole processing characteristics.

Also, in the case of the present embodiment, the pads 136 and the rewiring lands 138, which are for contacting the photoelectric conversion elements 114, 124, may be positioned on the first board part 110 and second board part 120, whereby the risk of loss of reliability due to bending may be minimized.

That is, even though the pads 136 and the rewiring lands 138 for contacting the photoelectric conversion elements 114, 124 may be formed on an optical waveguide 132 made of a flexible material, the first board part 110 and second board part 120 may be coupled at the upper and lower parts around the portions of the optical waveguide 132 where the pads 136 and the rewiring lands 138 are formed, to yield an effect similar to having the pads 136 and the rewiring lands 138 formed on an essentially rigid board, and thus ensure reliability.

In this embodiment, a structure is presented that has ledges 118, 128 formed respectively on the first board part 110 and second board part 120, and the optical waveguide 132 mounted on the ledges 118, 128. That is, both sides of the optical waveguide may each be covered by a rigid board.

Due to this structure, there is less likelihood of detaching occurring between the layer on which the optical waveguide is formed and an adjacent layer, to provide superb reliability.

Furthermore, as a result of forming the ledges 118, 128 for mounting the optical waveguide 132, portions of the layer on which the optical waveguide is formed may be the optical waveguide, while the remaining portions may be a rigid board. In this structure, the vias 116, 126 for interlayer connection may be formed in the rigid board portions, and it may not be necessary to form the vias in the optical waveguide, so that there may not be a need for considerations on either the plating characteristics with respect to the material forming the optical waveguide 132 or hole processing characteristics.

The electrical wiring layer 134 formed for transmitting electrical signals may be implemented by forming circuit patterns (not shown) on an insulation material high in flexibility, such as polyimide. As described earlier, by disposing the electrical wiring layer 134 in separation from the optical waveguide 132, neither may be affected by the other's bending, so that superb bendability and reliability may be provided.

Figure 3:
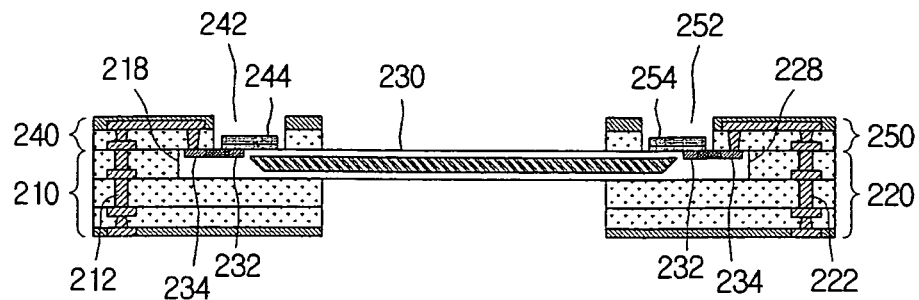
FIG. 3 is a cross-sectional view illustrating a printed circuit board according to a second disclosed embodiment of the invention.

FIG. 3 is a cross-sectional view illustrating a printed circuit board 200 according to a second disclosed embodiment of the invention. In FIG. 3 are illustrated a first board 210, a second board 220, vias 212, 222, ledges 218, 228, a flexible optical waveguide 230, pads 232, rewiring lands 234, a first outer board 240, a second outer board 250, grooves 242, 252, and photoelectric conversion elements 244, 254.

Components that are in correspondence with components of the first disclosed embodiment described with reference to FIG. 2 perform the same or similar functions as in the first disclosed embodiment. Thus, they will not be described again in detail.

Referring to FIG. 3, a printed circuit board is presented in which only the optical waveguide 230 is formed on the flexible portion, without the electrical wiring layer. In devices such as cell phones, both the optical waveguide 132 and the electrical wiring layer 134 may be needed, as in printed circuit board 100 of the first disclosed embodiment, because both electrical power and analog signals may be transmitted from the main board to the display board. In fields requiring the transmission only of high-speed digital signals, however, the desired functions may be performed only with the optical waveguide 230; with the electrical wiring layer removed, as presented in this embodiment.

Figure 4:
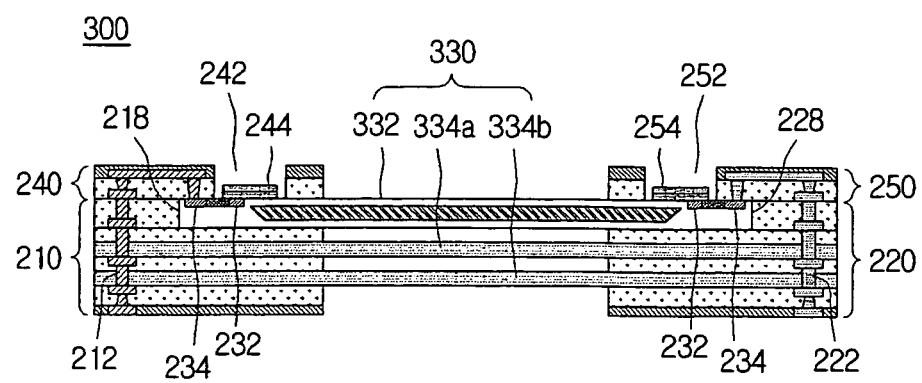
FIG. 4 is a cross-sectional view illustrating a printed circuit board according to a third disclosed embodiment of the invention.

FIG. 4 is a cross-sectional view illustrating a printed circuit board 300 according to a third disclosed embodiment of the invention. In FIG. 4 are illustrated a first board 210, a second board 220, vias 212, 222, ledges 218, 228, a first outer board 240, a second outer board 250, grooves 242, 252, photoelectric conversion elements 244, 254, a flexible board part 330, an optical waveguide 332, pads 232, rewiring lands 234, and electrical wiring layers 334a, 334b.

In contrast to the printed circuit boards according to the first and second disclosed embodiments presented in FIGS. 2 and 3, a printed circuit board according to the third disclosed embodiment presented in FIG. 4 may have multiple electrical wiring layers 334a, 334b. Other components that are in correspondence with components of the embodiments described above have the same or similar functions, and thus will not be described again in detail.

Referring to FIG. 4, a printed circuit board 300 is presented that has one optical waveguide 332 and multiple electrical wiring layers 334a, 334b. The case may be contemplated where an existing printed circuit board composed with a plurality of electrical wiring layers may have some of the layers replaced with optical waveguides 332 to perform the desired functions.

Figure 5:
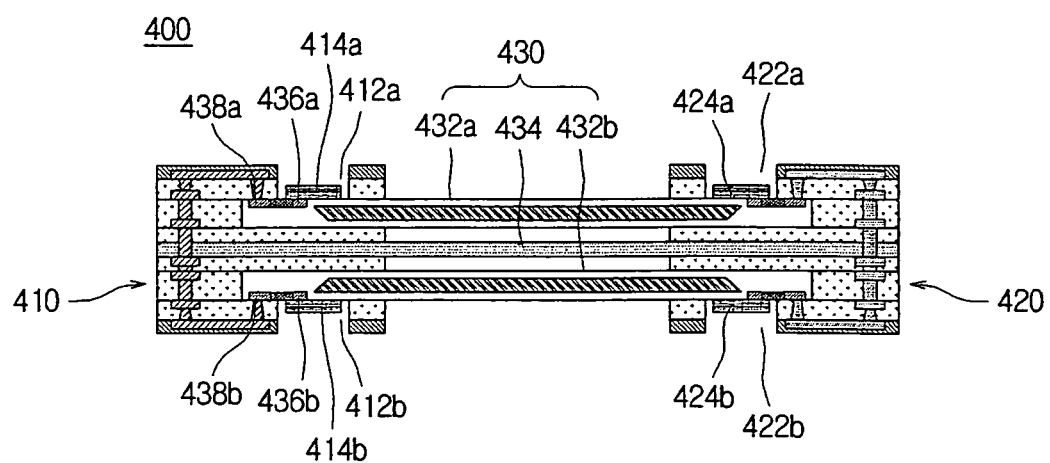
FIG. 5 is a cross-sectional view illustrating a printed circuit board according to a fourth disclosed embodiment of the invention.

Furthermore, a printed circuit board 400 may be presented which has a plurality of optical waveguides 432a, 432b, as illustrated in FIG. 5.

In a printed circuit board 100, 200, 300, 400 according to an embodiment of the claimed invention described above, a structure may be presented, in which the photoelectric conversion elements 114, 124, 244, 254 are installed directly on the optical waveguide, which may minimize optical loss.

With reference to the first disclosed embodiment of the invention as represented in FIG. 2, pads 136 may be formed on the optical waveguide 132 for the installing of the photoelectric conversion elements 114, 124, where the pads 136 may be made of copper or a corresponding conductive material. The pads 136 formed in this manner on the optical waveguide 132 and the photoelectric conversion elements 114, 124 may be placed in contact by wire bonding or in the form of flip chips.

Figure 6A:
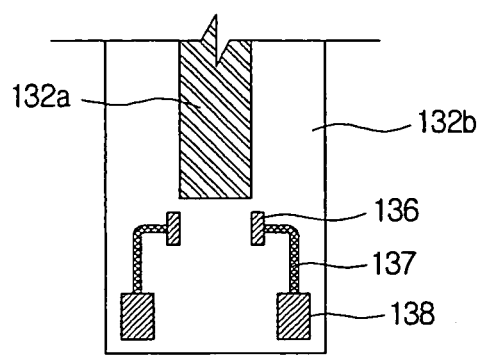
FIG. 6A and FIG. 6B are plan views illustrating portions on which photoelectric conversion elements are to be installed.
Figure 6B:
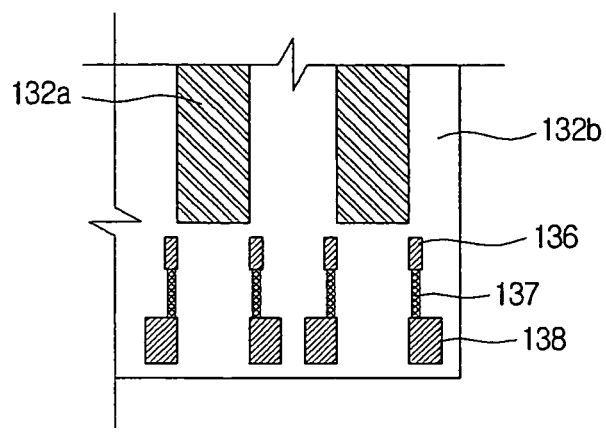

The patterns 137 extending from the pads 136 may be electrically connected with other layers at the rewiring lands 138 by way of the vias 116, 126, etc. When the photoelectric conversion elements are formed in multiples, the pads 136, patterns 137, and rewiring lands, etc., may be formed correspondingly, as illustrated in FIG. 6A and FIG. 6B.

Figure 7A:
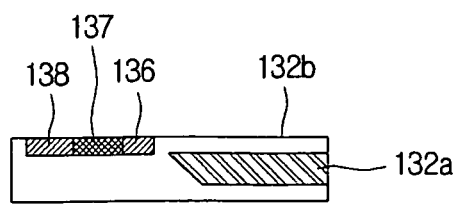
FIG. 7A and FIG. 7B are cross-sectional views illustrating portions on which photoelectric conversion elements are to be installed.
Figure 7B:
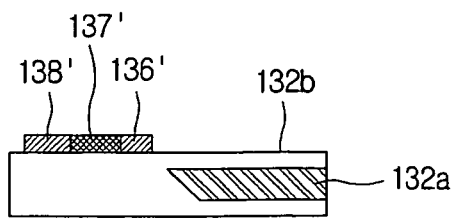

In addition, as illustrated in FIG. 7A and FIG. 7B, the pads 136, patterns 137, and rewiring lands 138, etc. may be formed buried in the optical waveguide (see FIG. 7A) or may be formed on the surface (see FIG. 7B). When these are buried in the optical waveguide, a method may be used, for example, of transcribing the patterns after separate patterning work, and when they are formed on the surface, a method may be used, for example, of performing etching after stacking a metal layer on the optical waveguide.

Next, a method of manufacturing a printed circuit board according to another aspect of the claimed invention will be described, with reference to FIGS. 8, 9A, 9B, 9C and 9D.

Figure 8:
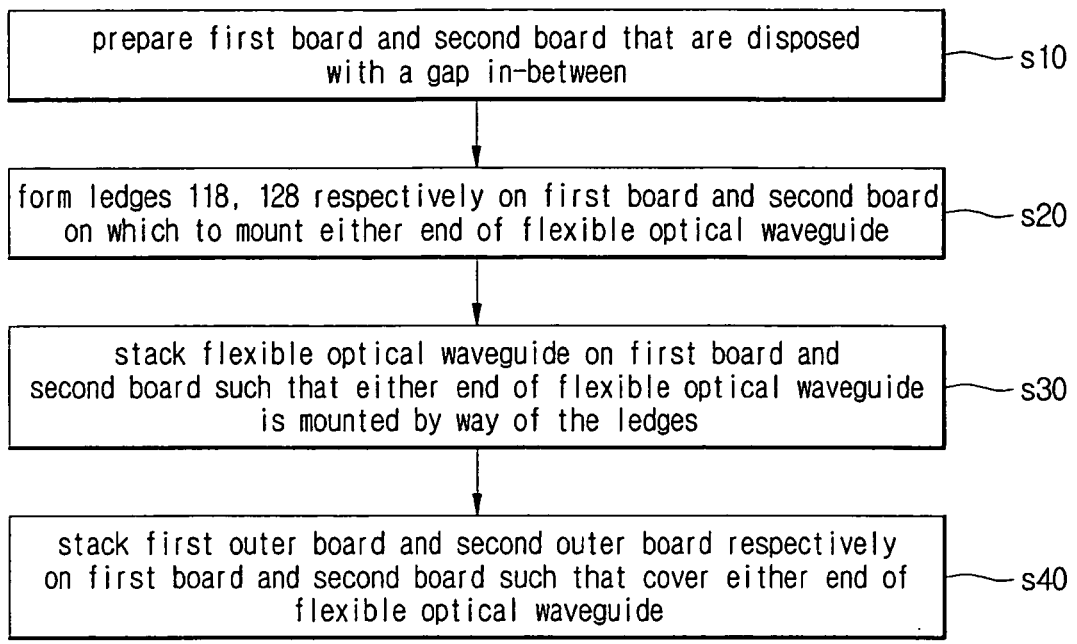
FIG. 8 is a flowchart illustrating a method of manufacturing a printed circuit board according to another embodiment of the invention.
Figure 9A:
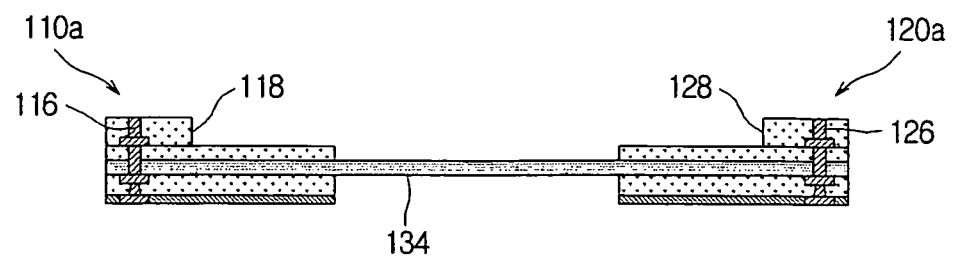
Figure 9B:
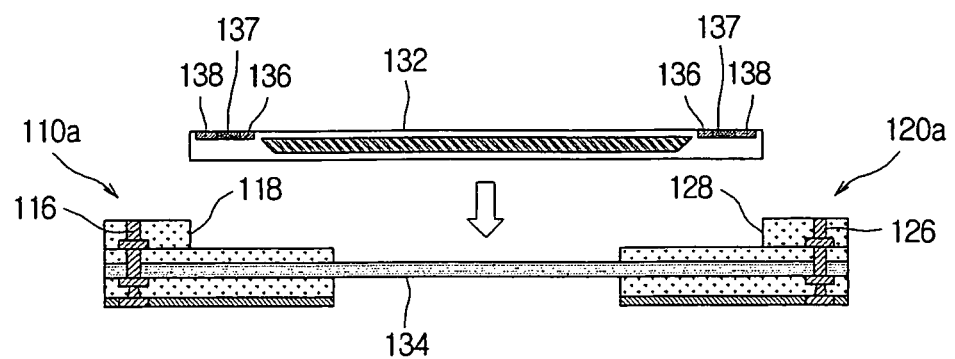
Figure 9D:
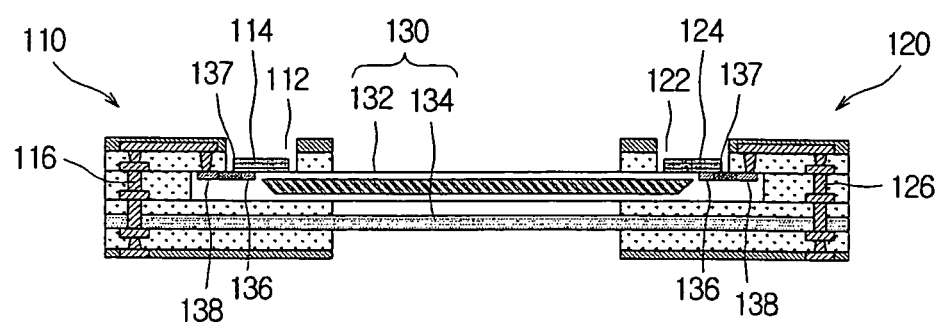

FIG. 8 is a flowchart illustrating a method of manufacturing a printed circuit board according to an embodiment of the invention, and FIG. 9A, FIG. 9B, FIG. 9C and FIG. 9D are flow diagrams illustrating a method of manufacturing a printed circuit board according to an embodiment of the invention. In FIGS. 9A to 9D are illustrated first board part 110 composed of a first board 110a and a first outer board 110b, a second board part 120 composed of a second board 120a and a second outer board 120b, grooves 112, 122, photoelectric conversion elements 114, 124, vias 116, 126, ledges 118, 128, a flexible board part 130, an optical waveguide 132, an electrical wiring layer 134, pads 136, patterns 137, and rewiring lands 138.

First, the first board and the second board may be prepared such that they are separated from each other (s10). The first board 110a and the second board 120a may each be coupled to either end of the flexible optical waveguide 132, to allow the exchange of optical signals. A flexible electrical wiring layer 134 may also be formed in the first board 110a and second board 120a, for exchanging electrical signals, or may be omitted in cases where an electrical wiring layer 134 is not required, such as when transmitting only high-speed digital data.

Next, ledges 118, 128 may be formed on the first board 110a and second board 120a on which either end of the flexible optical waveguide 132 can be mounted (s20), and the flexible optical waveguide 132 may be stacked on the first board 110a and second board 120a such that the flexible optical waveguide 132 is mounted onto the ledges 118, 128 (s30).

In other words, the method may be used of fabricating the optical waveguide 132 separately and inserting the optical waveguide 132 during the lay-up process in manufacturing the printed circuit board. For this, the first board 110a and second board 120a may be processed to form ledges 118, 128, and the optical waveguide 132 may be stacked such that the optical waveguide 132 is inserted into the ledges 118, 128, after which thermal compression may be performed under a high temperature and high pressure environment.

Afterwards, the first outer board 110b and second outer board 120b may each be stacked respectively on the first board 110a and second board 120a (s40). Both ends of the optical waveguide 132 may then be covered by the first outer board 110b and second outer board 120b, whereby the optical waveguide 132 may be coupled with each of the first board 110a and second board 120a.

In the first outer board 110b, a groove 112 may be formed to install the photoelectric conversion element 114. By forming the groove 112 and installing the photoelectric conversion element 114 in the groove 112, the overall thickness of the printed circuit board may be reduced. This groove 112 may be processed after the first outer board 110b is stacked, or may be processed before the stacking so that the first outer board 110b may be stacked with the groove 112 already formed. Of course, a groove 122 may be formed in the second outer board 120b, just as for the first outer board 110b, in which to install a photoelectric conversion element 124.

Also, in order that the photoelectric conversion element 114 may directly contact the optical waveguide 132, the groove 112 formed in the first outer board 110b may be formed to a depth that allows a portion of the optical waveguide 132 to be exposed. In other words, the groove 112 may be formed to penetrate the first outer board 110b.

In a predetermined position of the optical waveguide 132 exposed by such a groove 112, a pad 136 may be formed in direct contact with the photoelectric conversion element 114. Thus, the photoelectric conversion element 114 may directly contact the optical waveguide 132.

Moreover, the pads 136 may be formed buried in the optical waveguide 132, to reduce the overall thickness of the printed circuit board and minimize optical loss. These pads 136 that have a buried form may be formed using a method of performing patterning work on a separate carrier (not shown) and then transferring the patterning.

Rewiring lands 138 and patterns 137 electrically connected with the pads 136 may be formed on the optical waveguide 132, and by having the rewiring lands 138 be connected with the vias 116, 126, optical signals transmitted through the optical waveguide 132 and electrical signals converted from the optical signals may be transmitted throughout the entire printed circuit board.

Similar to the case of the pads 136, these rewiring lands 138 and patterns 137 may also have the form of being buried in the optical waveguide 132, and may also be formed using a method of performing patterning work on a separate carrier (not shown) and then transferring the patterning.

As set forth above, certain aspects of the invention can provide greater bendability and reliability, by having the optical waveguide and electrical wiring layer separated with a gap in-between at the flexible portion of the board, and the optical waveguide can be manufactured with greater precision, by having the optical waveguide manufactured separately and then inserted during the manufacturing process of the board.

In addition, optical loss can be minimized by installing the photoelectric conversion elements to be closely adjoining the optical waveguide, and the need can be eliminated for considerations on the plating characteristics with respect to the material forming the optical waveguide 132 or hole processing characteristics, by allowing rewiring through the electrical connections between the rewiring lands and vias.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A printed circuit board comprising:
a first board having a first ledge formed on one side thereof, the first ledge comprising a vertical portion and a horizontal portion extending in a lateral direction;
a second board having a second ledge formed on one side thereof and disposed with a gap of a predetermined distance with respect to the first board, the second ledge comprising a vertical portion and a horizontal portion extending in a lateral direction;
a flexible optical waveguide having either end mounted on each of the first ledge and the second ledge, the flexible optical waveguide being disposed between the vertical portion of the first ledge and the vertical portion of the second ledge; and
a first outer board and a second outer board stacked respectively on the first board and the second board such that either end of the flexible optical waveguide is covered.

2. The printed circuit board of claim 1, wherein a groove is formed adjacent to the optical waveguide in the first outer board, the groove configured to have the optical waveguide installed therein, and
the groove is exposed to the exterior.

3. The printed circuit board of claim 2, wherein a pad is formed adjacent to the groove on a predetermined position of the optical waveguide, the pad configured to have the optical waveguide mounted thereon.

4. The printed circuit board of claim 3, wherein the pad is buried in the optical waveguide.

5. The printed circuit board of claim 3, wherein a rewiring land is formed on the optical waveguide, the rewiring land electrically connected with the pad.

6. The printed circuit board of claim 5, wherein the rewiring land is buried in the optical waveguide.

7. The printed circuit board of claim 5, wherein the first board part comprises a via configured to interconnect layers, and
the rewiring land is electrically connected with the via.

8. A printed circuit board comprising:
a first board having a first ledge formed on one side thereof, the first ledge comprising a vertical portion and a horizontal portion extending in a lateral direction;
a second board having a second ledge formed on one side thereof and disposed with a gap of a predetermined distance with respect to the first board, the second ledge comprising a vertical portion and a horizontal portion extending in a lateral direction;
a flexible optical waveguide having either end mounted on each of the first ledge and the second ledge, both ends of the flexible optical waveguide being supported by the first ledge and the second ledge respectively, the flexible optical waveguide being disposed between the vertical portion of the first ledge and the vertical portion of the second ledge; and
a first outer board and a second outer board stacked respectively on the first board and the second board such that either end of the flexible optical waveguide is covered.

9. The printed circuit board of claim 8, wherein a groove is formed adjacent to the optical waveguide in the first outer board, the groove configured to have the optical waveguide installed therein, and the groove is exposed to the exterior.

10. The printed circuit board of claim 9, wherein a pad is formed adjacent to the groove on a predetermined position of the optical waveguide, the pad configured to have the optical waveguide mounted thereon.

11. The printed circuit board of claim 10, wherein the pad is buried in the optical waveguide.

12. The printed circuit board of claim 10, wherein a rewiring land is formed on the optical waveguide, the rewiring land electrically connected with the pad.

13. The printed circuit board of claim 12, wherein the rewiring land is buried in the optical waveguide.

14. The printed circuit board of claim 12, wherein the first board part comprises a via configured to interconnect layers, and the rewiring land is electrically connected with the via.

* * * * *